(12) United States Patent
Patel et al.

(10) Patent No.: US 7,081,684 B2
(45) Date of Patent: Jul. 25, 2006

(54) CONVERTING HEAT GENERATED BY A COMPONENT TO ELECTRICAL ENERGY

(75) Inventors: Chandrakant D. Patel, Fremont, CA (US); Salil Pradhan, Santa Clara, CA (US); Ratnesh Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 183 days.

(21) Appl. No.: 10/678,268

(22) Filed: Oct. 6, 2003

(65) Prior Publication Data

US 2005/0073150 A1    Apr. 7, 2005

(51) Int. Cl.
   *H02P 9/04*      (2006.01)
   *B60L 1/02*      (2006.01)
   *F01K 15/00*     (2006.01)
   *F02C 6/00*      (2006.01)
   *H01L 35/30*     (2006.01)

(52) U.S. Cl. ............................ 290/1 R; 290/2; 136/205

(58) Field of Classification Search ................ 290/1 R, 290/1 A, 2; 322/2 A; 310/300; 136/205
See application file for complete search history.

(56) References Cited

U.S. PATENT DOCUMENTS

| 4,449,576 A * | 5/1984 | Baum et al. ............ 165/104.33 |
| 4,647,836 A | 3/1987 | Olsen |
| 5,959,836 A * | 9/1999 | Bhatia ..................... 361/687 |
| 6,105,662 A * | 8/2000 | Suzuki ................. 165/104.33 |
| 6,239,513 B1 * | 5/2001 | Dean et al. ................... 307/64 |
| 6,394,175 B1 * | 5/2002 | Chen et al. ............... 165/80.3 |
| 6,502,405 B1 * | 1/2003 | Van Winkle ................. 62/3.61 |
| 6,528,898 B1 * | 3/2003 | Ikura et al. ................. 290/1 R |
| 6,657,358 B1 * | 12/2003 | Perner ........................ 310/300 |
| 6,712,621 B1 * | 3/2004 | Li et al. ........................ 439/65 |
| 6,722,139 B1 * | 4/2004 | Moon et al. .................. 62/3.2 |
| 6,799,282 B1 * | 9/2004 | Maeda et al. ............... 713/500 |
| 6,856,037 B1 * | 2/2005 | Yazawa et al. ............... 290/43 |
| 2002/0092557 A1 * | 7/2002 | Ghoshal ...................... 136/201 |
| 2003/0093995 A1 * | 5/2003 | Tadayon et al. .............. 60/651 |
| 2003/0117760 A1 * | 6/2003 | Meir ........................... 361/103 |

* cited by examiner

Primary Examiner—Julio C. Gonzalez

(57) ABSTRACT

A system for utilizing waste heat to provide power to an electronic device in a data center. The system includes at least one data center component configured to generate heat energy during operation thereof and a converter for receiving the heat energy generated by the at least one data center component. The converter is configured to convert the heat energy to electrical energy. The system also includes a power supply operable to be recharged through receipt of the electrical energy converted by the converter, and where the power supply is configured to deliver the electrical energy to the electronic device.

18 Claims, 6 Drawing Sheets

US 7,081,684 B2

CONVERTING HEAT GENERATED BY A COMPONENT TO ELECTRICAL ENERGY

FIELD OF THE INVENTION

The invention relates to powering a device. More particularly, the invention relates to utilization of waste heat to power the device.

BACKGROUND OF THE INVENTION

As discussed in greater length in the Background section of commonly assigned U.S. Pat. No. 6,574,104, filed on Oct. 5, 2001, by Patel et al., which is hereby incorporated by reference in its entirety, a data center may be defined as a location, e.g., room, that houses computer systems arranged in a number of electronics cabinets called racks. A standard rack may be defined as an Electronics Industry Association (EIA) enclosure, 78 in. (2 meters) wide, 24 in. (0.61 meter) wide and 30 in. (0.76 meter) deep. Standard racks may be configured to house a number of computer systems, e.g., about forty (40) systems, with future configurations of racks being designed to accommodate up to eighty (80) systems. The computer systems typically include a number of components, e.g., one or more of printed circuit boards (PCBs), mass storage devices, power supplies, processors, microcontrollers, semi-conductor devices, and the like, that may dissipate relatively significant amounts of heat during the operation of the respective components.

A relatively large number of devices are utilized in the data center to perform a variety of tasks, such as, sensors for detecting environmental conditions, status indicating apparatuses (lights, buzzers, etc.), and the like. These devices are typically powered by a direct current (DC) power source, such as batteries, or an alternating current (AC) power source. There are certain drawbacks associated with the use of these types of power sources. For instance, batteries typically require relatively frequent replacement which may be difficult and time consuming if large numbers of these devices are utilized. In addition, the use of AC power sources typically requires that a large number of wires be connected between the devices and the power sources. Thus, when the racks or components of a data center are added or re-arranged, the devices must also be moved or recalibrated. The movement and/or recalibration of the devices is oftentimes relatively difficult and requires a great deal of time and manual input since the wires connecting the devices to their power sources must also be moved. Therefore, the use of conventional power sources to operate these devices often results in relatively high operating costs.

SUMMARY OF THE INVENTION

According to an embodiment, the invention pertains to a system for utilizing waste heat to provide power to an electronic device in a data center. The system includes at least one data center component configured to generate heat energy during operation thereof and a converter for receiving the heat energy generated by the at least one data center component. The converter is configured to convert the heat energy to electrical energy. The system also includes a power supply operable to be recharged through receipt of the electrical energy converted by the converter, and where the power supply is configured to deliver the electrical energy to the electronic device.

According to another embodiment, the invention relates to a method for utilizing waste heat to power an electronic device in a data center. In the method, one or more components of a data center are activated, thereby creating heat energy. The heat energy generated by the one or more components is received and converted to electrical energy. In addition, at least one of a power supply and a power source is recharged with the converted electric energy.

According to yet another embodiment, the invention pertains to a system for utilizing waste heat to power an electronic device. The system includes: means for generating waste heat energy; means for receiving the waste heat energy generated by the means for generating waste heat energy; means for converting the waste heat energy generated by the means for generating waste heat energy into electrical energy; and means for recharging at least one of a power source and a power supply with the electrical energy, where the means for recharging at least one of a power source and a power supply includes means for powering the electronic device.

BRIEF DESCRIPTION OF THE DRAWINGS

The present invention is illustrated by way of example and not of limitation in the accompanying figures in which like numeral references refer to like elements, and wherein.

DETAILED DESCRIPTION OF THE INVENTION

Figure 1:
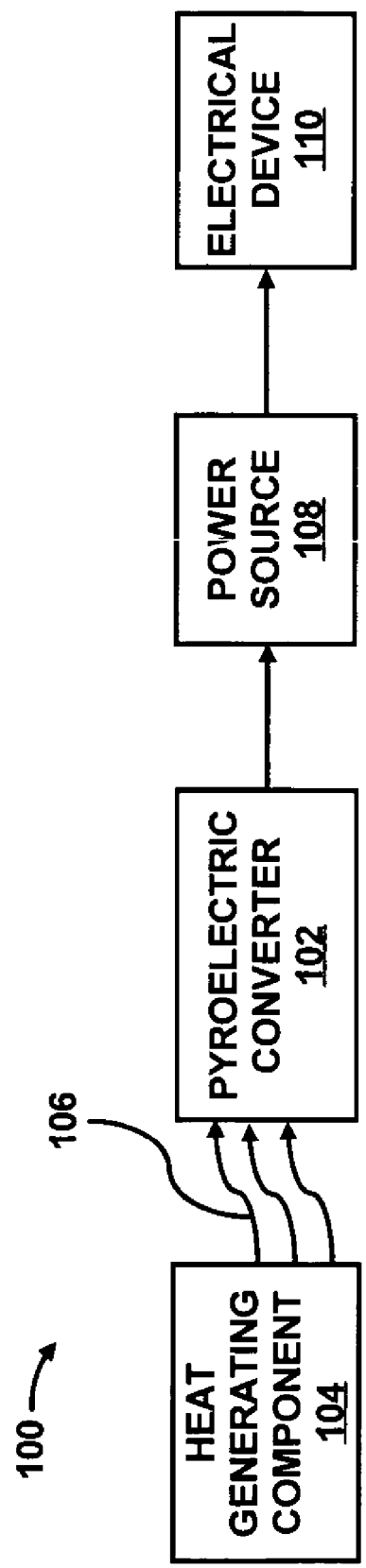
FIG. 1 illustrates a pyroelectric converter system, according to an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

According to an embodiment of the invention, an electronic device, e.g., a sensor, signal, light emitting diode, etc., receives power from a rechargeable power source. The rechargeable power source is charged through receipt of electrical energy, e.g., electricity, from a pyroelectric converter configured to convert heat energy into electrical energy. The heat supplied to the pyroelectric converter is generated in the form heat energy from one or more heat producing components, for example, servers or other components housed in racks located in a data center. The terms "data center" are generally meant to denote a room or other space and are not meant to limit the invention to any specific type of room where data is communicated or processed, nor should it be construed that use of the terms "data center" limit the invention in any respect other than its definition hereinabove.

According to another embodiment of the invention, heat is transferred from the one or more heat producing components through heat pipes. In addition, the heat energy may be collected from the one or more heat producing components and conducted through a thermal conduit to the pyroelectric converter. In this regard, heat energy from a plurality of heat producing components may be gathered to supply heat to the pyroelectric converter.

In addition, the electrical energy thus converted by the pyroelectric converter may be supplied to an uninterruptible power supply (UPS) to recharge a battery contained therein. In one regard, a number of pyroelectric converters may be wired to or form a micro-grid. The UPS may also be connected to the micro-grid and may receive electrical energy from the pyroelectric converters wired to the micro-grid. The UPS may utilize the electrical energy received from the pyroelectric converters to provide power to generally enable a relatively soft shutdown of one or more components in the event of, for example, a power outage.

According to a further embodiment of the invention, the heat energy generated through operation of an air conditioning (AC) unit may be converted into electrical energy by a pyroeiectric converter. For instance, the heat generated through operation of a blower of the AC unit may be harnessed to generate electrical energy. The electrical energy may be supplied to a UPS to recharge a battery contained therein. The UPS may become operational, for instance, in the event that the AC unit or other components in the data center require a relatively rapid shut-down, such as in the case of a power outage.

According to these and other embodiments of the invention, the costs associated with supplying energy in operating devices in, for example, the data center, may be reduced compared with known operating manners. In one respect, the heat energy utilized in the conversion to electrical energy by the pyroelectric converter is comprised mainly of waste heat generated during operation of the one or more heat generating components. Therefore, a separate power supply may not be required to operate the electronic devices. Moreover, a separate heat source may not be required to supply heat energy for conversion into electrical energy, according to embodiments of the invention. In addition, because the energy source is a waste product of the heat generating component operations, the costs associated with operating the devices that receive energy from the pyroelectric converter is relatively low compared to known energy sources. In another respect, through use of the pyroelectric converters according to embodiments of the invention, a complicated power distribution system with step-down transformers and inverters may be unnecessary to power certain devices in the data center.

With reference first to FIG. 1, there is illustrated a system 100 including a pyroelectric converter 102, according to an embodiment of the invention. Generally speaking, the pyroelectric converter 102 may be implemented to convert heat energy and/or temperature changes into electrical energy. The conversion of the heat energy into electrical energy may be effected in any reasonably suitable manner generally known to those of ordinary skill in the art. For example, the pyroelectric converter 102 may comprise pyroelectric material, such as stacks of vinylidine fluoride and trifluorethylene copolymer film. The pyroelectric converter may exhibit as much as 30% Carnot efficiency when these stacks are exposed to temperatures ranging between 30 and 80 degrees Celsius. In addition, further improvements may be obtained by thermal regeneration and advanced thermal-electrical cycling techniques.

Other examples of suitable pyroelectric converters include the pyroelectric converter disclosed in U.S. Pat. No. 4,647,836 issued to Olsen, the disclosure of which is hereby incorporated by reference in its entirety. Olsen discloses an apparatus and a method for converting heat to electrical energy by the use of one or more capacitors having temperature dependent capacitance.

According to an embodiment of the invention, other types of converting devices may be employed instead of the pyroelectric converter 102. For instance, thermoelectric or thermoionic devices may be used to utilize the waste heat energy generated during operation of certain electronic devices. Any reasonably suitable thermoelectric or thermoionic device known to those of ordinary skill in the art may be employed with embodiments of the invention. Although specific reference is made throughout the present disclosure of the use of pyroelectric converters, other types of converting devices may be employed with embodiments of the invention without departing from the scope of the invention.

In the system 100, the pyroelectric converter 102 is configured to receive heat from a heat generating component 104 as generally indicated by lines 106. The heat generating component 104 may comprise any electronic device that generates heat during its operation. In a data center, the heat generating component 104 may comprise processors, displays, disk drives, power supplies, air conditioning unit components, etc. A more detailed description of manners in which the pyroelectric converter 102 may be configured to receive heat from the heat generating component 104 is set forth hereinbelow.

In operation, the pyroelectric converter 102 is designed to convert the heat received from the heat generating component 104 into electrical energy. The pyroelectric converter 102 is also configured to provide the converted energy to a power source 108. The power source 108 may comprise any reasonably suitable powering device, e.g., a re-chargeable direct current (DC) battery. The power source 108 is further configured to store the electrical energy received from the pyroelectric converter 102 and to supply an electronic device 110 with the electrical energy.

According to an embodiment of the invention, the pyroelectric converter 102 is configured to supply the power source 108 through trickle-charging. That is, the power source 108 may be configured to receive relatively small amounts of electrical energy and substantially continuously recharge its battery.

In addition, the power source 108 is configured to provide power to an electronic device 110. More particularly, the power source 108 may be operable to provide power to one or more circuits (not shown) in the device 110. The device 110 may include any device, e.g., sensors, lights, buzzers, etc., that may be capable of receiving electrical charge from a rechargeable power source. In addition, the power source 108 may comprise a relatively inexpensive charge accumulator, e.g., a capacitance device, when there is a relatively abundant supply of hot air.

Figure 2:
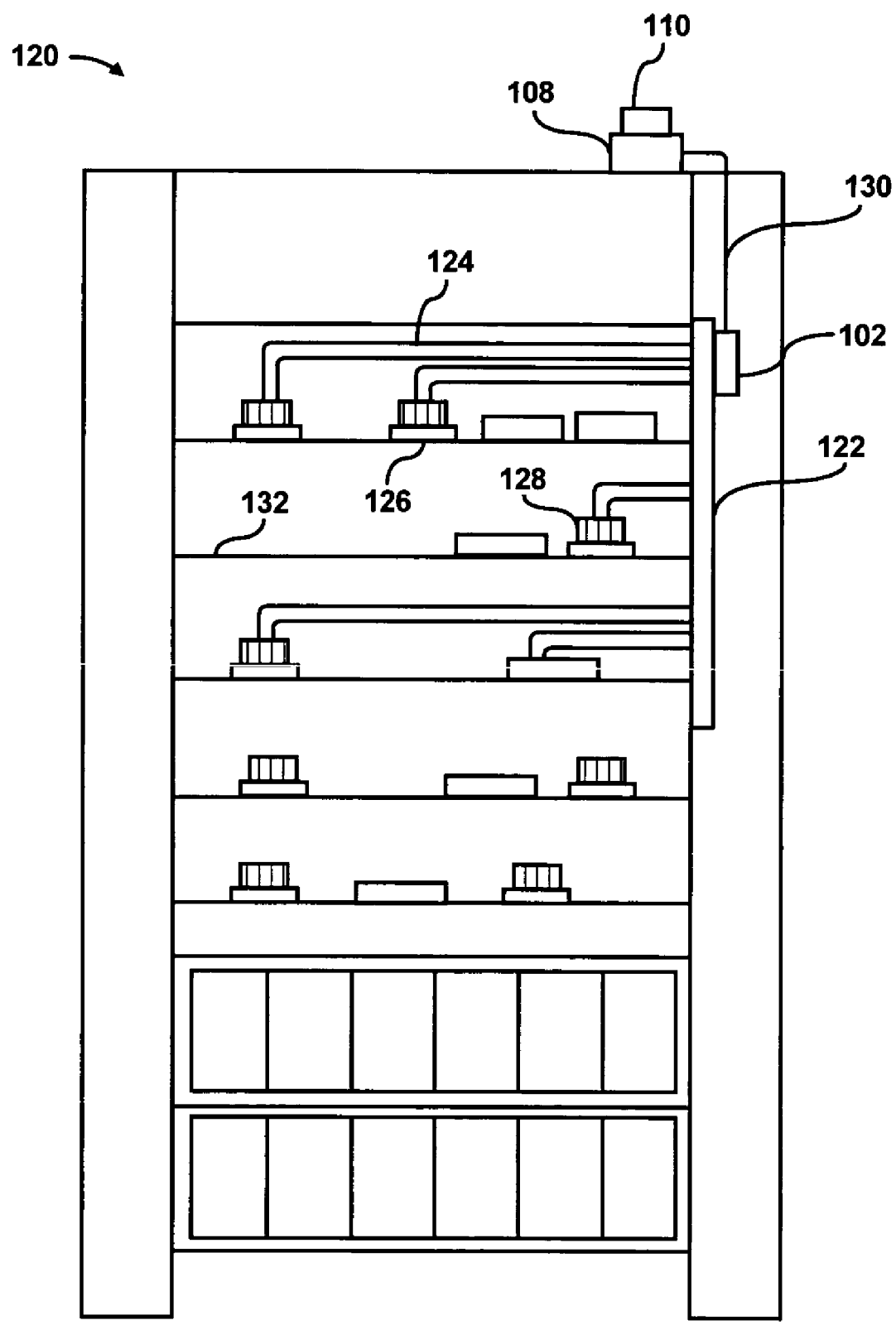
FIG. 2 depicts a simplified schematic illustration of a rack system employing a pyroelectric converter, according to an embodiment of the invention.

With reference now to FIG. 2, there is shown a simplified schematic illustration of a rack system 120 employing a pyroelectric converter 102 according to an embodiment of the invention. It should be readily apparent to those of ordinary skill in the art that the rack system 120 depicted in FIG. 2 represents a generalized illustration and that other components may be added or existing components may be removed or modified without departing from the scope of the invention. For example, the rack system 120 may include any number of heat generating components, mounting boards, heat pipes, etc. The depiction of the rack system 120 in FIG. 2 is thus for illustrative and simplicity of description purposes only and is not intended to limit the invention in any respect.

In FIG. 2, the pyroelectric converter 102 is illustrated as being attached to a thermal conduit 122. The thermal conduit 122 generally comprises a thermally conductive material and is positioned to conduct heat from a heat generating source to the pyroelectric converter 102.

The thermal conduit 122 may be attached to the pyroelectric converter 102 in a manner to enable substantially resistance free heat transfer between the thermal conduit 122 and the pyroelectric converter 102. For instance, the thermal conduit 122 may be attached to the pyroelectric converter 102 through thermally conductive adhesive, heat transfer epoxy, or some other known manner attaching components together in a thermally conductive manner. In addition, it should be understood that a heat transfer media may be positioned between the thermal conduit 122 and the pyroelectric converter 102 and may comprise materials that also enable relatively efficient thermal transfer, e.g., metals such as copper and the like.

The thermal conduit 122 is also attached to a plurality of heat pipes 124 in a manner to generally enable substantially unimpeded heat transfer from the heat pipes 124 to the thermal conduit 122. The heat pipes 124 are attached to respective heat generating components 126 and are also configured to receive heat from the heat generating components 126. Alternatively, the heat pipes 124 may be attached to heat sinks 128 configured to draw heat from the heat generating components 126. In addition, a heat transfer media may be positioned between these components and may comprise materials that also enable relatively efficient thermal transfer, e.g., metals such as copper and the like.

The heat generating components 126 are illustrated as being positioned on mounting boards 132 which are mounted to the rack system 120. The terms "mounting board" are broadly construed to mean central processing unit boards, system boards, network boards, printed circuit boards, and the like. The mounting boards 132 may include one or more of the heat generating components 126 mounted thereto. Typical heat generating components 126 may include processors, microprocessors, computer chips, network chips, power converters, memory blocks, memory controllers, central processing units, disk drives, power supplies, and the like. It should be understood that in certain instances it may not be beneficial to attach heat pipes 124 to each electronic component 126. Instead, it may be optimal to attach heat pipes 124 to those components 126 that generate the greatest amounts of heat.

The heat pipes 124 may comprise any reasonably suitable heat pipe capable of transferring heat, e.g., heat pipes available from THERMACORE, FUJIKURA, etc. The heat pipes 124 may comprise any reasonably suitable diameter and material. It will be apparent to one of ordinary skill in the art that the size and type of the heat pipe 124 employed in this and other embodiments may vary according to a variety of factors. These factors may include, heat load, available space, etc. The heat sinks 128 may comprise any reasonably suitable heat dissipating device known to those of ordinary skill in the art.

According to another embodiment of the invention, the thermal conduit 122 may be positioned to receive heat directly from the heat generating components 126 and/or the heat sinks 128. In this regard, the use of heat pipes 124 may be obviated. Alternatively, the pyroelectric converter 102 may be positioned to receive heat directly from the heat pipes 124. In this embodiment, the use of a thermal conduit 122 may be obviated.

The thermal conduit 122 is illustrated in FIG. 2 as being mounted to a sidewall of the rack system 120 and adjacent to a plurality of mounting boards 132. It will be apparent to one of ordinary skill in the art that the thermal conduit 122 may be mounted in other locations in the rack system 120 without deviating from the scope of the invention. Also, although a single electronic device 110 and one pyroelectric converter 102 are shown, multiple pyroelectric converters 102 may be connected to the thermal conduit 122 for powering multiple devices 110, which can be provided in various locations in and around the rack system 120. Furthermore, it should be apparent that the locations of the pyroelectric converter 102 and electronic device 110 depicted in FIG. 2 are for illustrative purposes only and that their locations may be optimized according to calculations based on the heat transfer resistance of the heat pipes and the thermal conduit 122.

According to an embodiment, the thermal conduit 122 may be an accumulator operable to draw heat from the heat generating components 126 via the heat pipes 124. For example, the thermal conduit 122 may be a block (e.g., copper, aluminum, etc.) with holes (not shown) into which the heat pipes 124 are inserted using a thermal compound interface. The block may draw, for example, from 500 to 1000 Watts of energy from various sources including the heat generating components 126. As shown in FIG. 2, the block or thermal conduit 122 is connected to the pyroelectric converter 102. Some or all of the heat from the accumulator may be converted to electrical energy by the pyroelectric converter 102. Heat that has not been converted may be dissipated into the environment and thus drawn away from the heat generating components 126.

Use of the thermal conduit 122 generally enables the pyroelectric converter 102 to supply substantially adequate amounts of electrical energy to a power source 108 even in situations where the conversion of the heat energy into electrical energy may be relatively inefficient. By way of example, if the thermal conduit 122 is positioned to receive 100 Watts of heat energy from each of 10 heat generating components 126 to thereby receive 1 kW of heat energy, even at conversion efficiency rates of between 1–3%, the pyroelectric converter 102 may produce 10–30 Watts of electrical energy from the waste heat produced by the heat generating components 126. The remaining 970–990 Watts of heat energy may be dissipated by cooling systems as described, for example, in U.S. Pat. No. 6,574,104.

In addition, through use of the thermal conduit 122 to aggregate the heat generated by heat generating components 126 into a single location, simpler and more efficient systems for dissipating the heat may be employed. For instance, conventional systems that do not utilize the thermal conduit 122 may require the use of a multitude of relatively small fans to cool the heat generating components 126. One problem associated with use of these types of fans is that they may produce a relatively large amount of noise since they are typically operated at high speeds. Another problem is that it may be difficult to generate adequate airflow through the racks 120 as components contained in the racks 120 may be relatively densely packed.

As illustrated in FIG. 2, the thermal conduit 122 may comprise a relatively large surface area, e.g., spanning multiple mounting boards 132, and may be positioned in a location that is generally separated from the heat generating components 126, e.g., in a side wall of the rack 120. Thus, by aggregating the heat dissipation into a single location through use of the thermal conduit 122, more efficient airflow characteristics around the thermal conduit 122 and a relatively larger fan or blower may be employed to dissipate the heat generated by the heat generating components 126. In addition, heat from the thermal conduit 122 may dissipated through use of a relatively more electrically efficient heat dissipating means as compared with known systems.

According to an embodiment of the invention, the system 100 may be used to provide power to a rechargeable power supply, e.g., 108. By way of example, a high density data center with 100 racks may generate up to 1 MW of heat. Thus, a substantial amount of heat may be available in data centers for conversion into electrical energy that can be used to power sensors as well as other electronic devices.

The heat generated by the heat generating component 126 may be transferred to the heat pipes 124, either directly or via the heat sinks 128, and then transferred to the thermal conduit 122. In one regard, the heat produced by the heat generating components 126 may be substantially drawn away from the heat generating components 126 to thus enable the temperatures around the heat generating components 126 to be maintained at desired levels. The thermal conduit 122 may then transfer the heat in the form of heat energy to the pyroelectric converter 102. The pyroelectric converter 102 may convert the heat energy into electrical energy as described hereinabove.

As further shown in FIG. 2, the pyroelectric converter 102 is connected to a power source 108 via a wire 130. The electrical energy converted by the pyroelectric converter 102 may then be conducted through the wire 130 to the power source 108. As described hereinabove, the power source 108 may include a battery which may be recharged through receipt of the electrical energy. In addition, the power source 108 is configured to supply power to an electronic device 110, e.g., sensor, light, signal, alarm, etc. In this regard, the electronic device 110 may be operated without requiring the use of, e.g., disposable batteries, an alternating current (AC) supply, etc.

By way of example, the electronic device 110 may comprise a location aware device configured to determine its location with respect to other location aware devices. Location aware devices were disclosed in commonly assigned and co-pending U.S. application Ser. No. 10/620,272, filed on Jul. 9, 2003, the disclosure of which is hereby incorporated by reference in its entirety. As discussed in that Application, the location aware device is also configured to detect one or more environmental conditions, e.g., temperature, humidity, pressure, etc., in its vicinity. Moreover, the location aware device is configured to transmit the detected one or more environmental conditions to other location aware devices and/or a cooling system controller operable to control cooling fluid delivery to and/or removal from various sections of the data center. The location aware devices require electrical energy to perform these operations and are generally configured to receive the required electrical energy from the pyroelectric converters 102 according to embodiments of the present invention.

Figure 3:
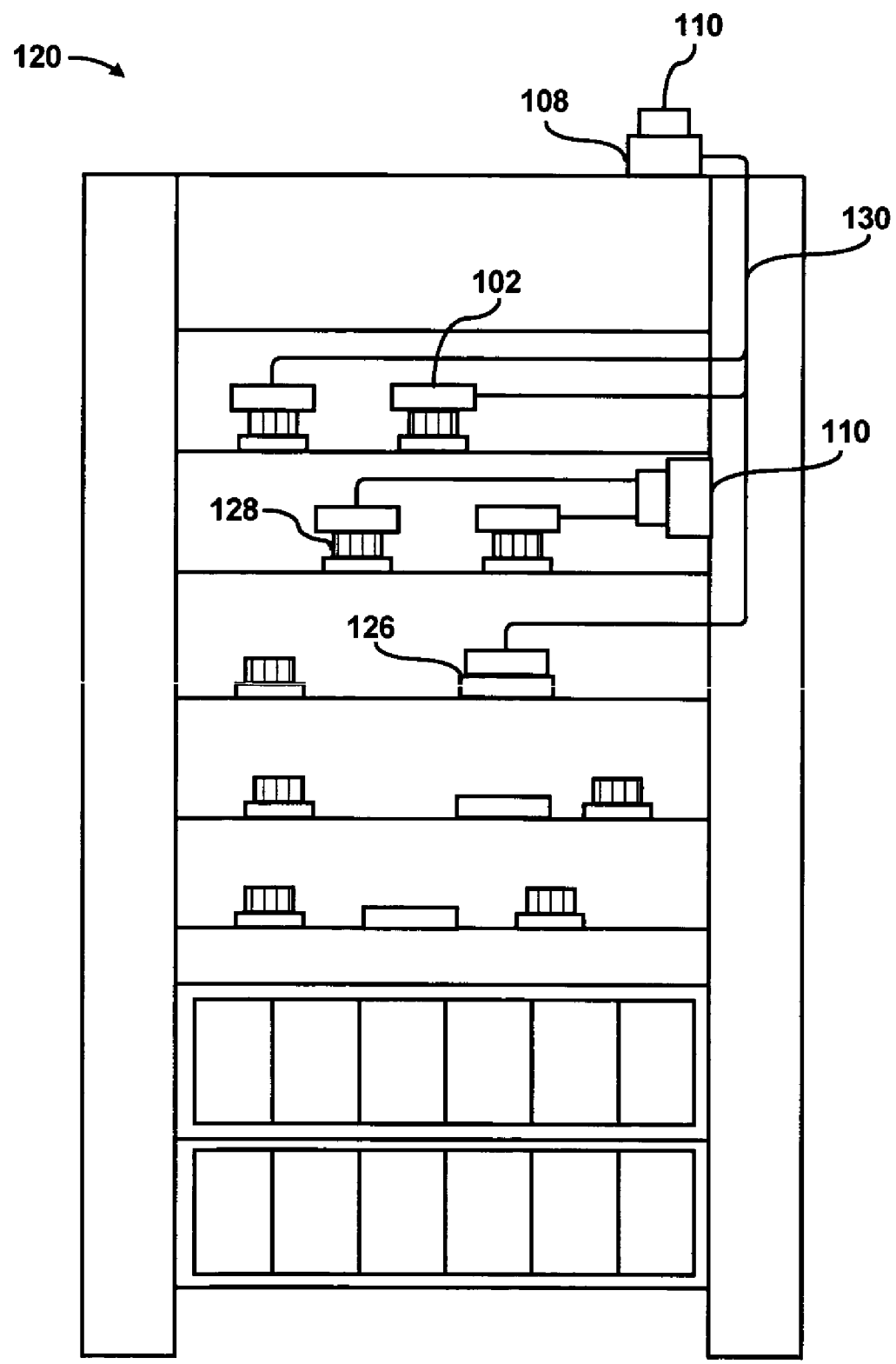
FIG. 3 depicts a simplified schematic illustration of a rack system employing a pyroelectric converter, according to another embodiment of the invention.

FIG. 3 depicts a simplified schematic illustration of a rack system 120 employing a pyroelectric converter 102, according to another embodiment of the invention. It should be readily apparent to those of ordinary skill in the art that the rack system 120 depicted in FIG. 3 represents a generalized illustration and that other components may be added or existing components may be removed or modified without departing from the scope of the invention. For example, the rack system 120 may include any number of heat generating components, mounting boards, pyroelectric converters, etc. The depiction of the rack system 120 in FIG. 3 is thus for illustrative and simplicity of description purposes only and is not intended to limit the invention in any respect.

In FIG. 3, pyroelectric converters 102 are connected directly to either the heat sinks 128 or the components 126. In this regard, the pyroelectric converters 102 are configured to receive heat energy relatively directly from the heat generating components 126 and/or the heat sinks 128. In one respect, the heat transfer between the pyroelectric converters 102 and respective ones of the heat generating components 126 may be more efficient than through use of the heat pipes 124 shown in FIG. 2.

The pyroelectric converters 102 may be attached to the heat generating components 126 or the heat sinks 128 in manners to enable substantially resistance free heat transfer therebetween. For instance, the pyroelectric converter 102 may be attached to the heat generating components 126 of the heat sinks 128 through thermally conductive adhesive, heat transfer epoxy, or some other known manner attaching components together in a thermally conductive manner. In addition, a heat transfer media may be positioned between the pyroelectric converter 102 and the heat generating components 126 or the heat sinks 128 and may comprise materials that also enable relatively efficient thermal transfer, e.g., metals such as copper and the like.

The pyroelectric converters 102 are also connected to a power source 108 via wires 130. Thus, as previously described hereinabove, the electrical energy produced by the pyroelectric converters 102 may be supplied to recharge a battery of the power source 108. In this regard, a plurality of pyroelectric converters 102 may be employed to supply electrical energy to a single power source 108. In addition, the power source 108 may provide electrical energy to operate an electronic device 110.

In operation, the pyroelectric converters 102 receive heat energy produced through operation of the heat generating components 126 and convert the heat energy into electrical energy. The electrical energy thus converted by the pyroelectric converters 102 are supplied to the power source 108. The electrical energy is then utilized by the power source 108 to replenish a rechargeable power supply, e.g., a battery. The electrical energy from the power source 108 is supplied to operate the electronic device 110.

Figure 4:
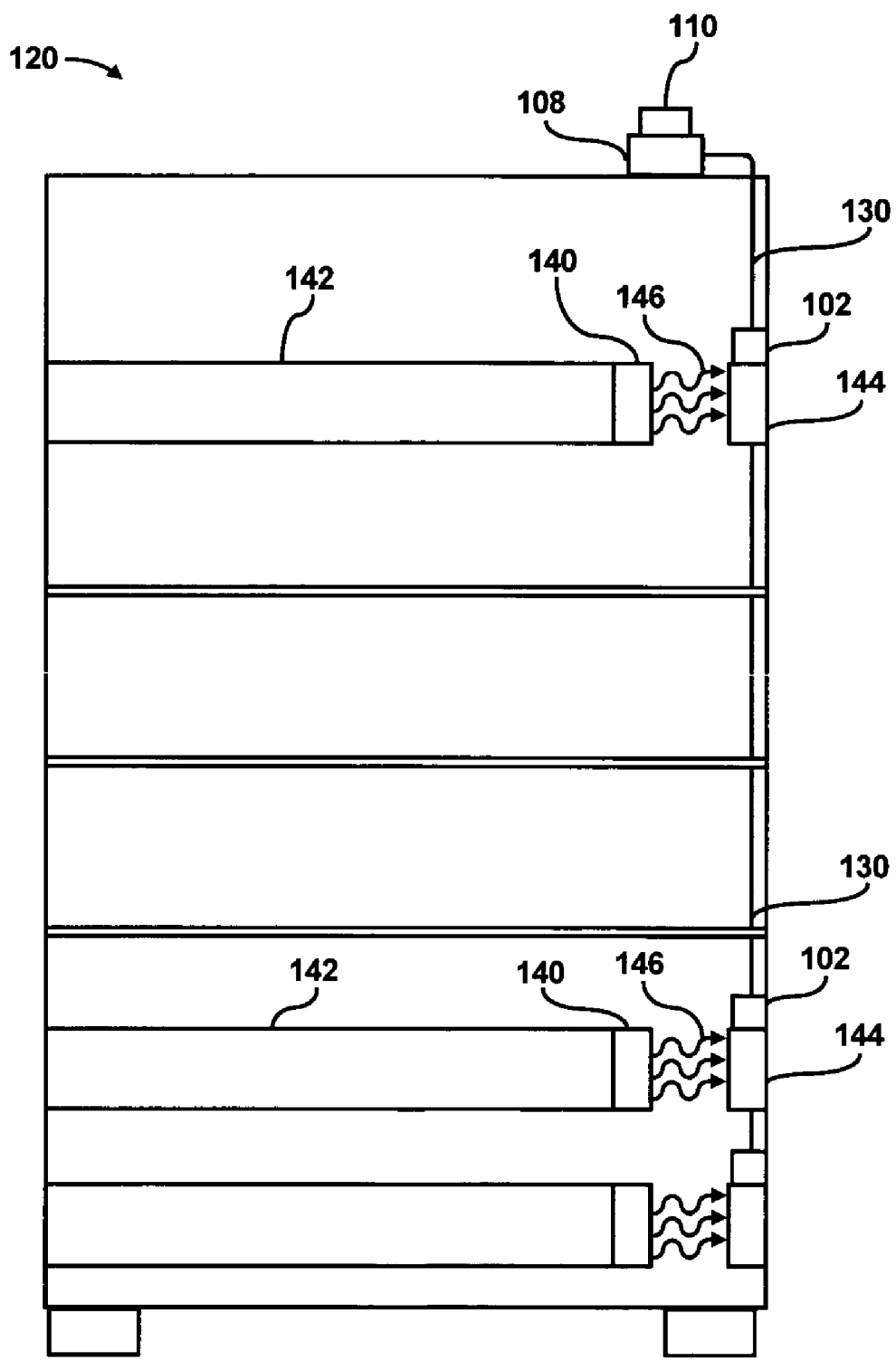
FIG. 4 depicts a simplified schematic illustration of a rack system employing a pyroelectric converter, according to yet another embodiment of the invention.

FIG. 4 depicts a simplified schematic illustration of a rack system 120 employing a pyroelectric converter 102, according to yet another embodiment of the invention. The rack system 120 depicted in FIG. 4 represents a generalized illustration and therefore, other components may be added or existing components may be removed or modified without departing from the scope of the invention. For example, the rack system 120 may include any number of heat generating components, mounting boards, pyroelectric converters, etc. The depiction of the rack system 120 in FIG. 4 is thus for illustrative and simplicity of description purposes only and is not intended to limit the invention in any respect.

In FIG. 4, the pyroelectric converters 102 may receive heat energy from one or more hot air streams, e.g., exhaust from exhaust fans 140. The exhaust fans 140 may be configured to draw heated air away from the electronic apparatus 142, e.g., servers, power supplies, etc., of the rack system 120. In addition, the electronic apparatuses 142 may include subsystems or heat generating components, e.g., one or more processors, memory devices, etc. The fans 140 may comprise fans supplied with the electronic apparatuses 142 or they may be added to the electronic apparatuses 142.

The fans 140 are generally configured to draw heated air from the electronic apparatuses 142 and to direct the flow of heated air outside of the rack system 120. In doing so, the heated airflow 146 may be caused to flow over pyroelectric converters 102 which are positioned substantially in the path of the heated airflow 146. In addition, the pyroelectric converters 102 may include a relatively large surface area and/or a thermal conduit 144. In this regard, the pyroelectric converters 102 may be capable of receiving larger portions of the heat exhausted from the electronic apparatuses 142.

As described in detail hereinabove, the pyroelectric converters 102 may convert the heat energy received from the heat generated in the electronic apparatuses into electrical energy. The electrical energy may be delivered to a power source 108 via wires 130. In addition, a plurality of pyroelectric converters 102 may be configured to supply the power source 108 with electrical energy. The power source 108 may store the received electrical energy 108 and provide the electrical energy to an electronic device 110 to thus provide power for its operations. Thus, as the waste heat is exhausted from within the rack system 120 to locations outside the rack system 120, the waste heat may be utilized to provide power to an electronic device 110.

Figure 5:
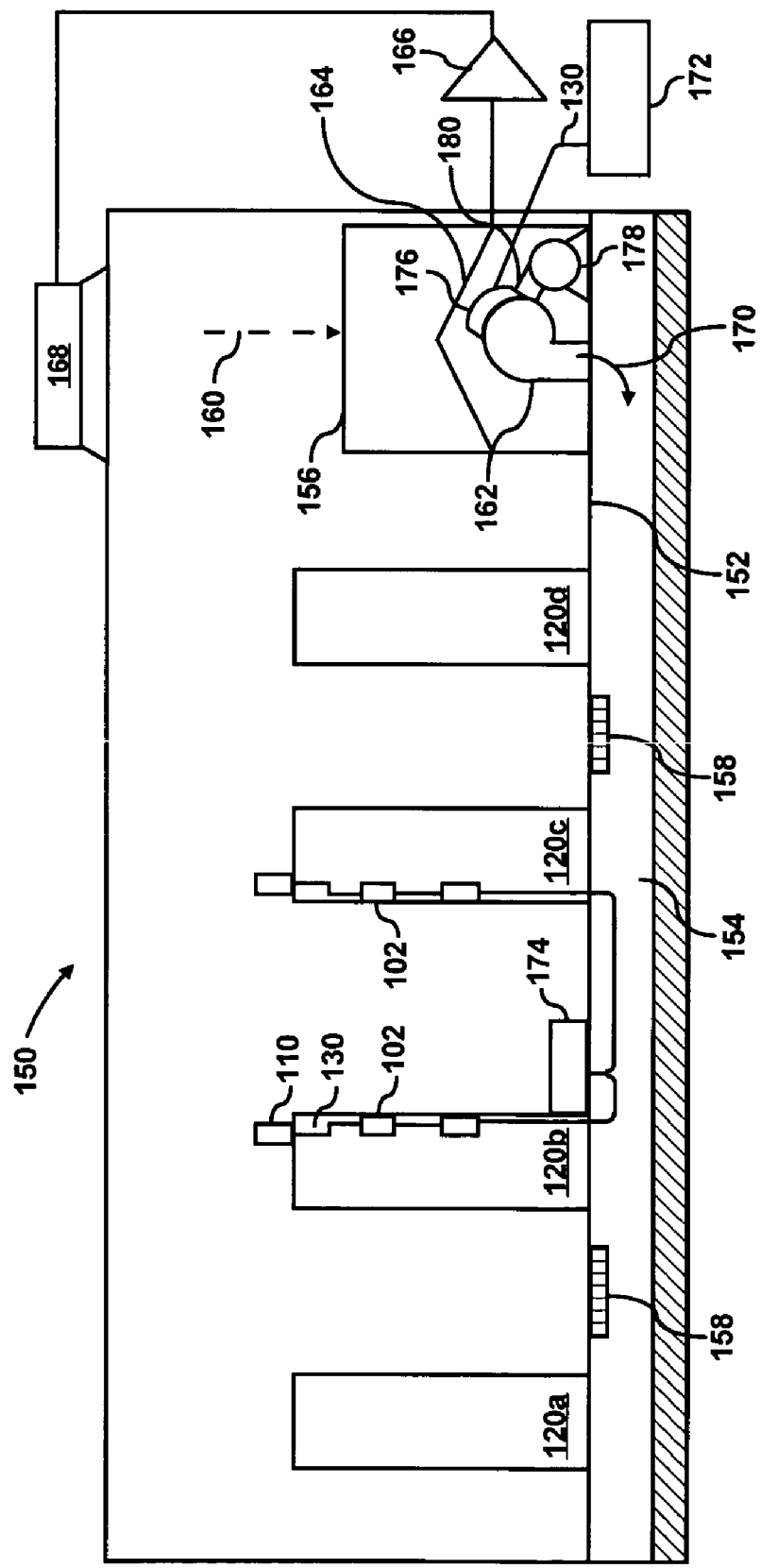
FIG. 5 is a simplified illustration of a side elevational view of a data center according to an embodiment of the invention.

With reference now to FIG. 5, there is shown a simplified illustration of a side elevational view of a data center 150, according to an embodiment of the invention. It should be readily apparent to those of ordinary skill in the art that the data center 150 depicted in FIG. 5 represents a generalized illustration and that other components may be added or existing components may be removed or modified without departing from the scope of the invention. For example, the data center 150 may include any number of racks and various other components. Thus, although the data center 150 is illustrated as containing four rows of racks 120a–120d, it should be understood that the data center 150 may include any number of racks, e.g., 100 racks, without departing from the scope of the invention. The depiction of four rows of racks 120a–120d is thus for illustrative and simplicity of description purposes only and is not intended to limit the invention in any respect.

In FIG. 5, racks 120a, 120b, 120d, and 120d are visible. It should be understood that other racks (not shown) may be hidden from view by the racks 120a–120d. It should also be understood that the racks 120a–120d are generally representative of the other racks that are hidden from view in FIG. 5. Also shown are pyroelectric converters 102 positioned to receive heat energy from heat generating components (not shown) housed in the racks 120b and 120d. The pyroelectric converters 102 are connected to electronic devices 110 via wires 130.

A description of the various other components of the data center 150 will now be provided. As shown in FIG. 5, the racks 120a–120d are supported on a raised floor 152. A plurality of wires and communication lines (not shown) may be located in a space 154 beneath the raised floor 152. The space 154 may also function as a plenum for delivery of cooling fluid from an air conditioning (AC) unit 156 to the racks 120a–120d. The cooling fluid may be delivered from the space 154 to the racks 120a–120d through vents 158 located between some or all of the racks 120a–120d. The vents 158 are shown as being located between racks 120a and 120b and 120d and 120d.

As described hereinabove, the AC unit 156 receives and cools heated cooling fluid, as generally indicated by the dashed arrow 160. In addition, the AC unit 156 supplies the racks 120a–120d with air that has been cooled, e.g., cooling fluid, through, for example, a process as described hereinafter. The AC unit 156 generally includes a fan or blower 162 for supplying cooling fluid (e.g., air) into the space 154 (e.g., plenum) and/or drawing air from the data center 150. In operation, the heated cooling fluid enters into the AC unit 156 as indicated by the arrow 160 and is cooled by operation of a cooling coil 164, a compressor 166, and a condenser 168, in a manner generally known to those of ordinary skill in the art. In terms of cooling system efficiency, it is generally desirable that the return air is composed of the relatively warmest portion of air in the data center 150.

The cooled cooling fluid generally flows from the fan or blower 162 into the space 154 as indicated by the arrow 170. The cooling fluid flows out of the raised floor 152 and into various areas of the racks 120a–120d through the vents 158. As the cooling fluid flows out of the vents 158, the cooling fluid may flow into the racks 120a–120d. The racks 120a–120d generally include inlets (not shown) to receive the cooling fluid from the vents 158. In addition, or alternatively, the front sides of some or all of the racks 120a–120d may comprise devices for substantially controlling the flow of cooling fluid into the racks 120a–120d. Examples of suitable devices are described in co-pending and commonly assigned U.S. patent application Ser. Nos. 10/425,621 and 10/425,624, both of which were filed on Apr. 30, 2003, the disclosures of which are hereby incorporated by reference in their entireties.

A more detailed description of the embodiments illustrated with respect to FIG. 5 may be found in co-pending and commonly assigned U.S. Pat. No. 6,574,104, which is hereby incorporated by reference in its entirety.

Also illustrated in FIG. 5 are uninterruptible power supplies (UPS's) 172 and 174. The UPS's 172 and 174 generally comprise rechargeable batteries and are generally configured to supply power to components in the data center 150 in the event that a relatively rapid shutdown is required. For instance, the UPS's 172 and 174 may be activated in response to a power outage. The power supplied, e.g., alternating current, to the components of the data center 150 may be fed through the UPS's 172 and 174. In one regard, when there is a need for a rapid shutdown, e.g., a power failure occurs, the UPS's 172 and 174 may supply sufficient electrical energy to the components of the data center 150 to enable a relatively safe and controlled shutdown of the components.

The UPS 172 is illustrated as receiving electrical energy from a pyroelectric converter 176 via a wire 130. The pyroelectric converter 176 may receive heat energy from operation of the fan or blower 162 and/or other heat dissipating components of the AC unit, e.g., a motor 178 configured to operate the fan or blower 162. Although the pyroelectric converter 176 is illustrated as being attached to the fan or blower 162, the pyroelectric converter 176 may be positioned to optimize heat energy receipt from one or more components of the AC unit 156, such as the motor 178. In one regard, the pyroelectric converter 176 may be attached to the casing of the blower 172 or the motor 178 to substantially directly receive heat energy from the blower 172 or motor 178. In addition, or as an alternative, one or more heat pipes or other heat transfer components may be employed to transport the heat energy from the blower 172 or motor 178 to the pyroelectric converter 176. Moreover, a heat energy accumulator, e.g., thermal conduit 122, may be employed to accumulate the heat energy from a plurality of heat sources, e.g., AC unit components, and deliver the heat energy to the pyroelectric converter 176. In this regard, the pyroelectric converter 176 may be positioned at a distance from the AC unit.

The fan or blower 162 is operated through rotation of the motor 178 which causes a belt 180 to actuate the fan or blower 162. In its operation, the a 150 kW AC unit may consume more than 10 kW of electrical energy. In this example, approximately 30 percent of the actual power supplied to the fan or blower 162 and motor 178 may be converted to move the cooling fluid out of the AC unit 156. The remaining approximately 7 kW is wasted as heat. Therefore, the pyroelectric converter 176 may receive a relatively substantial amount of heat energy from operation of the fan or blower 162 and motor 178.

Although the UPS 172 is illustrated as receiving electrical energy from the pyroelectric converter 162, it should be understood that the UPS 172 may receive electrical energy from any number of pyroelectric converters located either in the AC unit or at various positions in the data center 150 without departing from the scope of the invention. In addition, the UPS 172 may be positioned at any reasonably suitable location in and around the data center 150 without departing from the scope of the invention.

The UPS 174 is illustrated as receiving electrical energy from a plurality of pyroelectric converters 102 via wires 130. The pyroelectric converters 102 are also illustrated as providing electrical energy to electronic devices 110. In this regard, the pyroelectric converters 102 may be configured to provide electrical energy to either or both of the electronic device 110 and the UPS 174. The UPS 174 may receive the electrical energy from the pyroelectric converters 102 and, as described hereinabove, supply power to the components of the racks 120b and 120d in the event that electrical energy from the UPS 174 is required.

The racks 120a–102d may be categorized into a number of micro-grids according to, for example, the locations of the UPS's 174. For instance, the racks 120b and 120d may be included in a micro-grid with the UPS 174. In addition, other racks and other UPS's (not shown) may also form other micro-grids. In this regard, each UPS may be configured to receive electrical energy from the pyroelectric converters located within their respective micro-grids and also supply power to those respective micro-grids in, for example, the event of a power outage. In addition, or alternatively, all of the pyroelectric converters in the data center may form a single micro-grid and the UPS's 174 may be configured to receive electrical energy from the single micro-grid.

Figure 6:
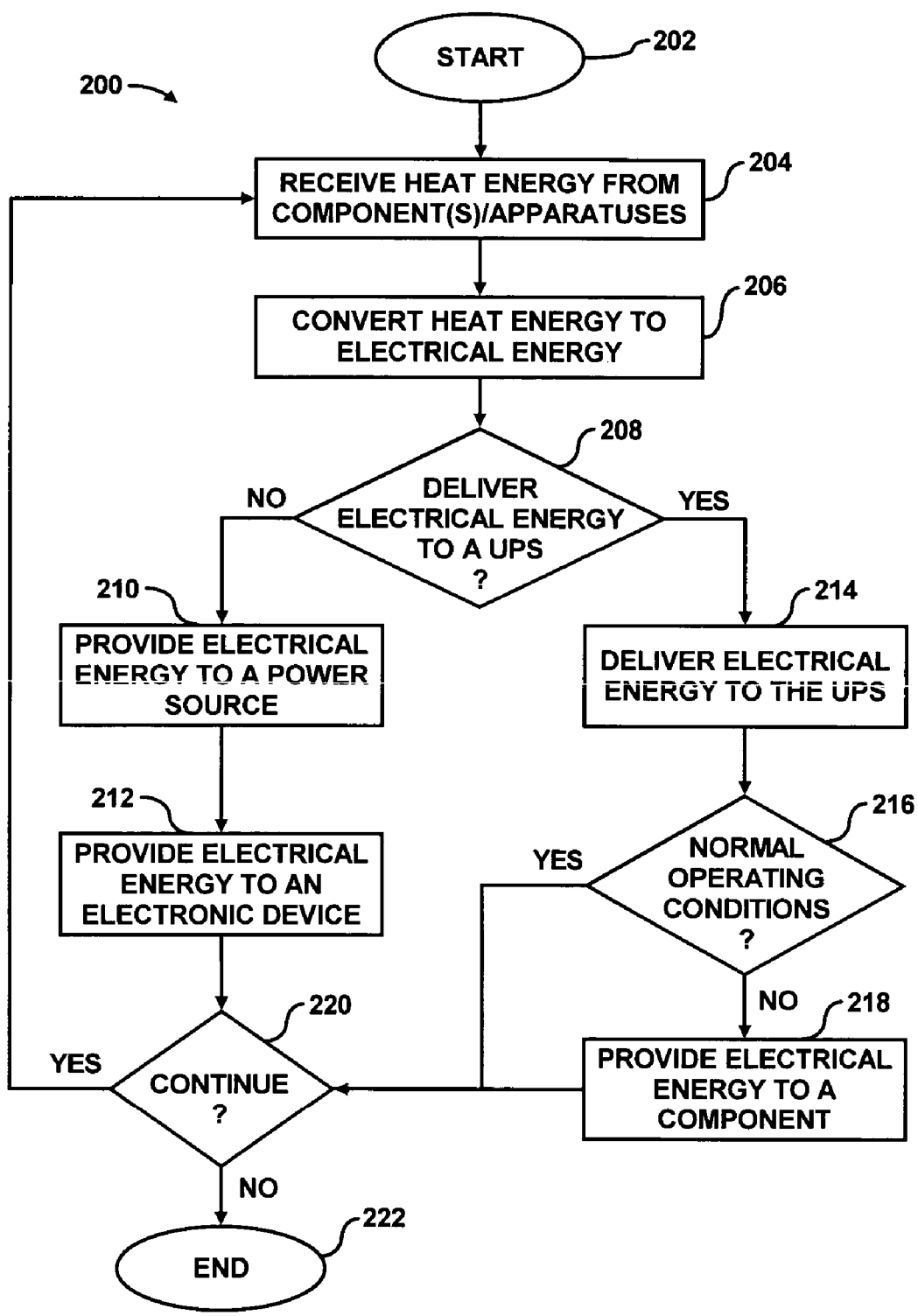
FIG. 6 illustrates an exemplary flow diagram of an operational mode for utilization of waste heat in a data center, according to an embodiment of the invention.

FIG. 6 illustrates an exemplary flow diagram of an operational mode 200 for utilization of waste heat in a data center, according to an embodiment of the invention. It is to be understood that the following description of the operational mode 200 is but one manner of a variety of different manners in which an embodiment of the invention may be practiced. It should also be apparent to those of ordinary skill in the art that the operational mode 200 represents a generalized illustration and that other steps may be added or existing steps may be removed, modified or rearranged without departing from the scope of the invention.

The description of the operational mode 200 is made with reference to the rack systems 120 illustrated in FIGS. 2–4 and the data center 150 illustrated in FIG. 5, and thus makes reference to the elements cited therein. It should, however, be understood that the operational mode 200 is not limited to the elements set forth in those figures. Instead, it should be understood that the operational mode 200 may be practiced in rack systems and data centers having different configurations than those set forth in FIGS. 2–5.

The operational mode 200 may be initiated in response to a variety of stimuli at step 202. For example, the operational mode 200 may be initiated in response to the rack system 120 or data center 150 becoming operational, e.g., turned on, waking from a sleep mode, manually initiated, etc. At step 202, the heat generating components 126, electronic apparatuses 142, and/or AC unit 156 may be activated and begin to generate heat. At step 204, one or more pyroelectric converters 102, 176 may receive the heat generated by the heat generating components 126, the electronic apparatuses 142, and/or the AC unit 156.

By way of example, as illustrated in FIGS. 2 and 3, heat produced by the heat generating components 126 may be utilized to provide heat energy to the pyroelectric converters 102. The heat energy may be transferred to the pyroelectric converters 102 through use of heat pipes 124 and/or a thermal conduit 122. Alternatively, the heat energy may be directly transferred to the pyroelectric converters through substantially direct thermal attachment between the pyroelectric converters 102 and the heat generating components 126 and/or heat sinks 128.

As another example, as illustrated in FIG. 4, heat produced by the electronic apparatuses 142 may be provided to the pyroelectric converters 102. The heat transfer between the electronic apparatuses 142 and the pyroelectric converters 102 may be effectuated through the flow of heated air over the pyroelectric converters 102.

As a further example, as illustrated in FIG. 5, the pyroelectric converters 176 may receive heat energy from components of the AC unit 156, e.g., the fan or blower 162. The transfer of heat energy may be effectuated through heat transfer between the AC unit 156 components and the pyroelectric converter 176.

At step 206, the pyroelectric converters 102, 176 may convert the received heat energy into electrical energy. The conversion of the heat energy into electrical energy may be effectuated in any reasonably suitable manner, e.g., the pyroelectric converters 102, 176 may comprise pyroelectric material, such as stacks of vinylidine fluoride and trifluorethylene copolymer film.

At step 208, it may be determined whether some or all of the electrical energy converted at step 206 is to be delivered to a UPS, e.g., UPS 172, 174. If it is determined that the electrical energy is not to be delivered or directed to the UPS, the converted energy may be supplied to a power source 108 at step 210. For instance, the pyroelectric converters 102 may be wired to the power source 108 and may be configured to transfer the electrical energy to the power source 108 via the wired connection. In addition, the power source 108 may store the received electrical energy in, for example, a battery, and may comprise a rechargeable power source. The decision to provide electrical energy to a power source at step 210 may be based upon, for example, the wiring configuration of the pyroelectric converters 102 and the UPS's. For instance, the decision to provide electrical energy to a UPS at step 208 may always be "no" where the pyroelectric converters 102 are not wired to a UPS.

The stored electrical energy may be supplied to power an electronic device 110 at step 212. The electronic device 110 may comprise any device capable of operating in an environment where heat generating components are present, e.g., sensor, light-emitting diode, alarm, location aware device, etc. By way of example, in a data center comprising a plurality of racks, the electronic device 110 may comprise a sensor configured to detect one or more environmental conditions, e.g., temperature, pressure, humidity, and the like. In this regard, the heat energy produced by the heat generating components housed in the racks of the data center during their operations may be utilized to power the electronic device 110. In addition, the information obtained by the electronic device 110 may be employed to, for example, vary cooling fluid delivery to the heat generating components in a manner similar to that described in commonly assigned U.S. Pat. No. 6,574,104, the disclosure of which is hereby incorporated by reference in its entirety.

As another example, the electronic device 110 may be configured as an alarm, either visual or audible. That is, the electronic device 110 may be configured to become activated when it detects an abnormal condition, e.g., high temperature, high moisture, sudden temperature spikes, etc. In this example, the electronic device 110 may be configured to display a signal and/or signal an alarm in the event that one of these conditions are detected. Although specific examples of the electronic device 110 and its operations have been provided, it should be understood that the embodiments of the invention may find use in other applications as well.

If it is determined that electrical energy is to be delivered to a UPS at step 208, the converted energy may be delivered to one or more UPS's at step 214. As described hereinabove, the electrical energy may be delivered to one or more UPS's either directly or via a connection to a commonly wired micro-grid. As also described hereinabove, the UPS's may store the electrical energy in a battery. Although not specifically illustrated in FIG. 2, the pyroelectric converters 102, 176 may be configured to provide power substantially simultaneously to both the power source 108 and the UPS 172, 174. In one regard, a regulating device may be implemented to regulate the delivery of the electrical energy to either or both the power source 108 and the UPS 172, 174. In another regard, the electrical energy may be provided to, for example, the micro-grid and the power source 108 and the UPS 172, 174 may be wired to the micro-grid and may receive the electrical energy. In yet another regard, one or both of the power source 108 and the UPS 172, 174 may cease to receive electrical energy from the pyroelectric converters 102, 176 when their respective batteries have been fully charged and the electrical energy may be diverted to the power source 108 or the UPS 172, 174 that has capacity to store the electrical energy.

At step 216, it may be determined whether the components in the data center are operating under normal conditions. For instance, it may be determined whether adequate power is being supplied to the components. If it is determined that there is inadequate power being supplied to the components, e.g., a power outage, defective power source, etc., the UPS may provide electrical energy to one or more components that are not receiving adequate power at step 218. The power supplied to the one or more components may be employed, for instance, to enable a relatively safe shut-down operation of the one or more components.

At step 220, it may be determined whether the operational mode 200 is to be continued. The operational mode 200 may continue for an indefinite period of time, e.g., so long as the rack system 120 and/or data center 150 is operational, for a predetermined period of time, between predetermined time periods, etc. If it is determined that the operational mode 200 is to continue, steps 204–220 may be repeated. On the other hand, if it is determined that the operational mode 200 is to be discontinued, the operational mode 200 may end as indicated at step 222. Step 222 may be similar to an idle mode for the operational mode 200 since the operational mode 200 may be reactivated, for instance, when one or more of the rack systems 120 become activated.

By virtue of certain embodiments of the invention, heat energy created during operation of components in an electronic system, e.g., a computer, servers in a data center, AC units, etc., may be converted to electrical energy. More particularly, the heat energy produced during operation of these components, which is generally considered a waste product, may be accumulated and used to power other electronic devices in the data center. In addition, the electrical energy produced from the waste heat may be used to recharge the batteries of UPS's. Thus, as the components are operated and thereby dissipate heat, the heat is captured and converted into electrical energy to power the other electronic devices. In one regard, through use of the waste heat to power these electronic devices, the costs associated with operating a data center may be reduced in comparison with known data center configurations.

In addition, because the electronic devices need not be wired to a separate power source, when the racks of a data center are moved or replaced, the electronic devices may not require re-wiring. Moreover, because the electronic devices need not be powered by replaceable batteries, replacement of the batteries may be avoided. Therefore, the costs associated with operating the data center may be relatively reduced through the implementation of embodiments of the invention.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A system for utilizing waste heat to provide power to a plurality of electronic devices in a data center, said system comprising:
   a plurality of racks, each of said plurality of racks housing at least one data center component configured to generate heat energy during operation thereof;
   a plurality of converters for receiving the heat energy generated by said at least one data center component in each of the plurality of racks, wherein the plurality converters are configured to convert the heat energy to electrical energy, and wherein the plurality of converters and the electronic are attached to each of the plurality of racks; and
   a power supply operable to be recharged through receipt of the electrical energy converted by the converters, and wherein the power supply is configured to deliver the electrical energy to the electronic devices.

2. The system according to claim 1, wherein said at least one data center component comprises one or more of a server, processor, microprocessor, rack power supply, and blower.

3. The system according to claim 1, wherein said power supply is configured to be trickle-charged by said electrical energy.

4. The system according to claim 3, wherein said power supply is at least one of a rechargeable battery and a capacitance device.

5. The system according to claim 1, wherein said power supply is part of an uninterruptible power source configured to supply electrical energy to the one or more data center components to enable relatively safe shutdown of one or more data center components in the event of a power outage.

6. The system according to claim 1, further comprising a heat sink connected to the at least one data center component for conducting heat generated by the at least one data center component to the converter.

7. The system according to claim 1, further comprising a heat pipe connected between the at least one data center component and the converter, wherein said heat pipe is configured to conduct heat generated by the at least one data center component to the converter.

8. The system according to claim 7, further comprising a heat sink in thermal connection between the heat pipe and the at least one data center component.

9. The system according to claim 1, further comprising a fan configured to exhaust heated air flow from the at least one data center component, wherein the converter is located in a path of the heated air flow.

10. the system according to claim 1, wherein the at least one data center component at least one apparatus of an air conditioning unit.

11. the system according to claim 1, wherein the electronic device comprises one or more of an environment condition sensor, an alarm, a light-emitting diode, and a location aware device.

12. The system according to claim 1, wherein the converter comprises at least one of a pyroelectric converter, a thermoelectric device, and a thermoionic device.

13. A system for utilizing waste heat to provide power to an electronic device in a data center, said system comprising:
    at least one data center component configured to generate heat energy during operation thereof;
    a converter for receiving the heat energy generated by said at least one data center components, wherein the converter is configured to convert the heat energy to electrical energy;
    a power supply operable to be recharged through receipt of the electrical energy converted by the converter, and wherein the power supply is configured to deliver the electrical energy to the electronic device;
    a plurality of heat pipes in thermal connection with a plurality of data center components; and
    a thermal conduit in thermal connection with said plurality of heat pipes and the converter, wherein the thermal conduit is configured to conduct heat from the plurality of heat pipes to the converter.

14. The system according to claim 13, wherein the plurality of heat pipes are connected to the plurality of data center components via a plurality of heat sinks.

15. The system according to claim 13, wherein the thermal conduit comprises an accumulator operable to accumulate heat from the plurality of heat pipes for conduction to the converter.

16. The system according to claim 13, wherein the thermal conduit enables sufficient heat transfer from the plurality of data center components to the converter to enable the converter to supply the power supply with electrical energy in a configuration yielding relatively inefficient conversion of heat energy into electrical energy by the converter.

17. The system according to claim 13, wherein the thermal conduit comprises a relatively large surface area and is positioned at a location that is spaced from the plurality of data center components.

18. A system for utilizing waste heat to provide power to an electronic device in a data center, said system comprising:
    at least one data center component configured to generate heat energy during operation thereof;
    a converter for receiving the heat energy generated by said at least one data center component, wherein the converter is configured to convert the heat energy to electrical energy;
    a power supply operable to be recharged through receipt of the electrical energy converted by the converter, and wherein the power supply is configured to deliver the electrical energy to the electronic device; and
    one more racks housing the at least one data center components, wherein said one or more racks are categorized into one or more micro-grids within a data center, and configured to supply electric energy to an uninterruptible power source configured to supply power to enable a relatively safe shutdown of one or more data components housed in the racks of the one of the one or more micro-grids in the event of a power outage.

* * * * *

UNITED STATES PATENT AND TRADEMARK OFFICE
CERTIFICATE OF CORRECTION

| | | |
|---|---|---|
| PATENT NO. | : 7,081,684 B2 | Page 1 of 2 |
| APPLICATION NO. | : 10/678268 | |
| DATED | : July 25, 2006 | |
| INVENTOR(S) | : Chandrakant D. Patel et al. | |

It is certified that error appears in the above-identified patent and that said Letters Patent is hereby corrected as shown below:

In column 3, line 27, delete "pyroeiectric" and insert -- pyroelectric --, therefor.

In column 9, line 43, after "120 b" delete "120d," and insert -- 120c, --, therefor.

In column 9, line 50, delete "120d." and insert -- 120c. --, therefor.

In column 9, line 64, after "120 b and" delete "120d" and insert -- 120c --, therefor.

In column 11, line 33, delete "120d" and insert -- 120c --, therefor.

In column 11, line 37, delete "120d" and insert -- 120c --, therefor.

In column 14, line 43, in Claim 1, delete "thereof;" and insert -- thereof, said racks configured to house a plurality of data center components at a plurality of location along each of the plurality of racks; --, therefor.

In column 14, line 46, in Claim 1, after "wherein the plurality" insert -- of --.

In column 14, line 49, in Claim 1, after "electronic" insert -- devices --.

In column 15, line 19, in Claim 10, delete "the system" and insert -- The system --, therefor.

In column 15, line 20, in Claim 10, after "component" insert -- comprises --.

In column 15, line 22, in Claim 11, delete "the system" and insert -- The system --, therefor.

UNITED STATES PATENT AND TRADEMARK OFFICE
CERTIFICATE OF CORRECTION

PATENT NO.         : 7,081,684 B2
APPLICATION NO. : 10/678268
DATED               : July 25, 2006
INVENTOR(S)       : Chandrakant D. Patel et al.

It is certified that error appears in the above-identified patent and that said Letters Patent is hereby corrected as shown below:

In column 15, line 23, in Claim 11, delete "environment" and insert -- environmental --, therefor.

Signed and Sealed this

Twenty-second Day of December, 2009

David J. Kappos
*Director of the United States Patent and Trademark Office*